United States Patent
Sathianathan (10) Patent No.: US 8,547,778 B2
(45) Date of Patent: Oct. 1, 2013

(54) APPARATUS AND METHOD FOR CONVERTING STATIC MEMORY ADDRESS TO MEMORY ADDRESS PULSE

(75) Inventor: Harikaran Sathianathan, Campbell, CA (US)

(73) Assignee: Oracle International Corporation, Redwood City, CA (US)

( * ) Notice: Subject to any disclaimer, the term of this patent is extended or adjusted under 35 U.S.C. 154(b) by 130 days.

(21) Appl. No.: 13/252,945

(22) Filed: Oct. 4, 2011

(65) Prior Publication Data

US 2013/0083618 A1    Apr. 4, 2013

(51) Int. Cl.
*G11C 8/00*    (2006.01)

(52) U.S. Cl.
USPC ............... 365/230.06; 365/194; 365/230.08

(58) Field of Classification Search
USPC ............. 365/189.08, 189.06, 189.07, 191, 365/194, 230.06, 230.08, 230.01, 243
See application file for complete search history.

(56) References Cited

U.S. PATENT DOCUMENTS

| 6,393,600 B1 * | 5/2002 | Sribhashyam et al. .. 365/189.05 |
| 6,879,526 B2 * | 4/2005 | Lynch et al. ............. 365/189.12 |
| 2003/0031082 A1 * | 2/2003 | Sawada ........................ 365/233 |

* cited by examiner

*Primary Examiner* — Alexander Sofocleous
*Assistant Examiner* — Hien Nguyen
(74) *Attorney, Agent, or Firm* — Martine Penilla Group, LLP (57) ABSTRACT

A tri-state NAND circuit includes a first input connected to receive a first input signal and a second input connected to receive a second input signal. The tri-state NAND circuit is connected to operate in accordance with a first clock signal and a second clock signal. A logic state of the second clock signal is opposite a logic state of the first clock signal. The tri-state NAND circuit is connected to transmit an output signal to a first node. A tri-state latch circuit is connected to hold a signal present at the first node in accordance with the first clock signal and the second clock signal. A pulse generating NAND circuit includes a first input connected to the first node and a second input connected to receive the first clock signal. The pulse generating NAND circuit is connected to transmit an output signal to a second node.

20 Claims, 6 Drawing Sheets

APPARATUS AND METHOD FOR CONVERTING STATIC MEMORY ADDRESS TO MEMORY ADDRESS PULSE

BACKGROUND

The continual trend toward smaller transistor device size in modern integrated circuits has enabled faster transistor operation and correspondingly faster signal propagation speeds within those circuits. Most modern computing devices utilize memory circuitry to store data required for device operation. These computing devices include combinational logic circuitry that depends upon timely receipt of data that is read from the memory circuitry. Therefore, as the speed of signal propagation through the combinational logic circuitry increases by way of the smaller transistor device size, it is possible that the memory access circuitry can become a signal timing bottleneck within the computing device. In memory circuits, a memory access speed in performing a read operation may be limited by the speed at which a requested memory address can be decoded and transformed into an appropriate wordline signal. It is of interest to improve memory access speed to mitigate the effects of memory access circuitry as a signal timing bottleneck. It is within this context that the present invention arises.

SUMMARY

In one embodiment, a circuit is disclosed to include a tri-state NAND circuit, a tri-state latch circuit, and a pulse generating NAND circuit. The tri-state NAND circuit includes a first input connected to receive a first input signal and a second input connected to receive a second input signal. The tri-state NAND circuit is connected to operate in accordance with a first clock signal and a second clock signal. A logic state of the second clock signal is opposite a logic state of the first clock signal. The tri-state NAND circuit is connected to transmit an output signal to a first node. The tri-state latch circuit is connected to hold a signal present at the first node in accordance with the first clock signal and the second clock signal. The pulse generating NAND circuit includes a first input connected to the first node and a second input connected to receive the first clock signal. The pulse generating NAND circuit is connected to transmit an output signal to a second node.

In one embodiment, a memory timing access path is disclosed to include a tri-state NAND circuit, a tri-state latch circuit, and a pulse generating NAND circuit. The tri-state NAND circuit is defined and connected to perform a NAND logic operation on a pair of memory address decode signals to generate a first wordline pulse precursor signal. Operation of the tri-state NAND circuit to generate the first wordline pulse precursor signal is directed by first and second clock signals. The first and second clock signals having opposite logic states. The tri-state latch circuit is defined and connected to hold the first wordline pulse precursor signal, upon operation of the tri-state latch circuit as directed by the first and second clock signals. The tri-state NAND circuit and the tri-state latch circuit are directed by the first and second clock signals to operate at mutually exclusive times. The pulse generating NAND circuit is defined and connected to perform a NAND logic operation on the first wordline pulse precursor signal and the first clock signal to generate a second wordline pulse precursor signal.

In one embodiment, a method is disclosed for operating a memory timing access path. The method includes generating first and second clock signals to have opposite logic states at a given time. The method also includes operating a tri-state NAND circuit to perform a NAND logic operation on a pair of memory address decode signals to generate a first wordline pulse precursor signal, when the first clock signal has a low logic state and the second clock signal has a high logic state. The method also includes operating a tri-state latch circuit to hold the first wordline pulse precursor signal, when the first clock signal has a high logic state and the second clock signal has a low logic state. The method further includes operating a pulse generating NAND circuit to perform a NAND logic operation on the first wordline pulse precursor signal and the first clock signal to generate a second wordline pulse precursor signal.

Other aspects and advantages of the invention will become more apparent from the following detailed description, taken in conjunction with the accompanying drawings, illustrating by way of example the present invention.

DETAILED DESCRIPTION

In the following description, numerous specific details are set forth in order to provide a thorough understanding of the present invention. It will be apparent, however, to one skilled in the art that the present invention may be practiced without some or all of these specific details. In other instances, well known process operations have not been described in detail in order not to unnecessarily obscure the present invention.

Figure 1:
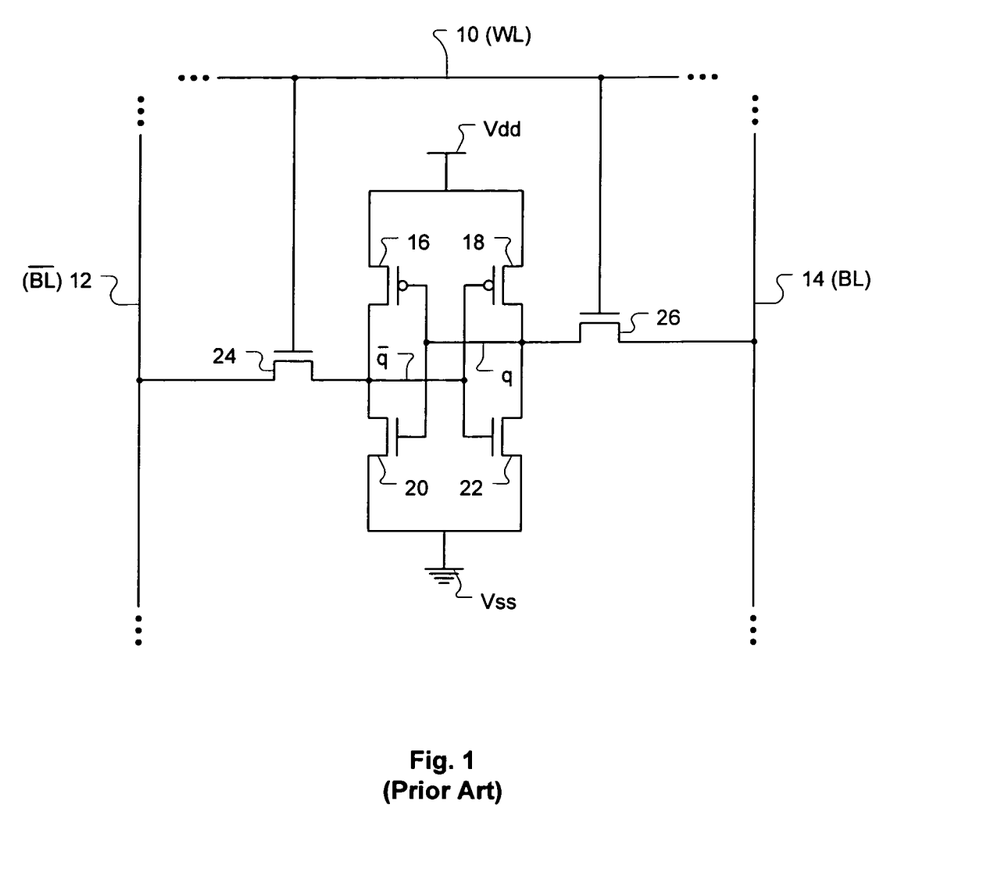
FIG. 1 shows a bitcell of a static random access memory (SRAM).

FIG. 1 shows a bitcell of a static random access memory (SRAM). The bitcell includes a pair of cross-coupled inverters defined to store a logic state (q) and its complement ($\bar{q}$). Specifically, a PMOS transistor 18 and an NMOS transistor 22 form a first inverter. A PMOS transistor 16 and an NMOS transistor 20 form a second inverter. Each of the PMOS transistors 18 and 16 has a terminal connected to a power supply Vdd. Each of the NMOS transistors 20 and 22 has a terminal connected to a reference ground potential Vss. The gates of the PMOS transistor 16 and NMOS transistor 20 of the second inverter are connected to the output of the first inverter which stores (q). The gates of the PMOS transistor 18 and NMOS transistor 22 of the first inverter are connected to the output of the second inverter which stores ($\bar{q}$). The output of the first inverter is further connected through a pass gate NMOS transistor 26 to a bitline 14 (BL). The output of the second inverter is further connected through a pass gate NMOS transistor 24 to a complement bitline 12 ($\overline{BL}$). Each gate of the pass gate NMOS transistors 24 and 26 is connected to a wordline 10 (WL).

During a write operation, a logic state to be written to the bitcell is applied to the bitline 14 (BL), and its opposite logic state is applied to the complement bitline 12 ($\overline{BL}$). Then, the wordline 10 (WL) is asserted by increasing a voltage level on the wordline 10 (WL) to cause the pass gate NMOS transistors 24 and 26 to turn on. When the pass gate NMOS transistor 26 turns on, the logic state applied to the bitline 14 (BL) is transmitted to a node of the bitcell on which (q) is stored, i.e., to the output of the first inverter and gates of the second inverter. Also, when the pass gate NMOS transistor 24 turns on, the logic state applied to the complement bitline 12 ($\overline{BL}$) is transmitted to a node of the bitcell on which ($\overline{q}$) is stored, i.e., to the output of the second inverter and gates of the first inverter. It should be understood that signal drivers on the bitline 14 (BL) and complement bitline 12 ($\overline{BL}$) have sufficiently high signal drive strength to allow the signals from the bitline 14 (BL) and complement bitline 12 ($\overline{BL}$) to override signals present on the (q) and ($\overline{q}$) nodes within the bitcell. Then, when the wordline 10 (WL) is unasserted, the pass gate NMOS transistors 24 and 26 are turned off, and the logic states present on the (q) and ($\overline{q}$) nodes within the bitcell are held by the first and second cross-coupled inverters.

During a read operation, both the bitline 14 (BL) and complement bitline 12 ($\overline{BL}$) are pre-charged to a voltage level indicative of a high logic state. Then, the wordline 10 (WL) is asserted by increasing a voltage level on the wordline 10 (WL) to cause the pass gate NMOS transistors 24 and 26 to turn on. When the pass gate NMOS transistors 24 and 26 turn on, the bitline 14 (BL) will attain the logic state present on the (q) node within the bitcell, and the complement bitline 12 ($\overline{BL}$) will attain the logic state present on the ($\overline{q}$) node within the bitcell. For instance, if a high logic state is stored at the (q) node, then the bitline 14 (BL) will retain the high logic state of its pre-charged condition. Also, in this instance, the low logic state stored at the ($\overline{q}$) node will be transferred to the complement bitline 12 ($\overline{BL}$) by discharge of the complement bitline 12 ($\overline{BL}$) from its pre-charged condition to the reference ground potential Vss by way of the NMOS transistor 20. Similarly, if a low logic state is stored at the (q) node, the low logic state stored at the (q) node will be transferred to the bitline 14 (BL) by discharge of the bitline 14 (BL) from its pre-charged condition to the reference ground potential Vss by way of the NMOS transistor 22. Also, in this instance, the complement bitline 12 ($\overline{BL}$) will retain the high logic state of its pre-charged condition.

As the bitlines 14 (BL) and 12 ($\overline{BL}$) transition from their pre-charged condition to the logic states present the (q) and ($\overline{q}$) nodes, a sense amplifier connected to the bitlines 14 (BL) and 12 ($\overline{BL}$) functions to sense which bitline has a higher charge relative to the other so a to determine whether a high or a low logic state is stored in the bit cell. Specifically, if the sense amplifier senses that the bitline 14 (BL) is attaining a higher voltage relative to the complement bitline 12 ($\overline{BL}$), then the sense amplifier will determine that a high logic state is stored in the bitcell at the (q) node. Also, if the sense amplifier senses that the complement bitline 12 ($\overline{BL}$) is attaining a higher voltage relative to the bitline 14 (BL), then the sense amplifier will determine that a low logic state is stored in the bitcell at the (q) node.

Based on the above discussion, it should be appreciated that the speed of the read operation is dependent in part on how fast a wordline pulse (WLP) can be generated and transmitted along the wordline 10 (WL) to affect control of the gates of the pass gate NMOS transistors 24 and 26 of the bitcell. In one embodiment, a multi-cycle SRAM timing access path is defined to generate and transmit the wordline pulse (WLP) to the appropriate wordline of the SRAM. In one embodiment, the multi-cycle SRAM timing access path is defined to transmit received address signals through pipeline stages of static logic gates before converting the received address signals to pulses to drive the appropriate wordlines within the SRAM.

Figure 2:
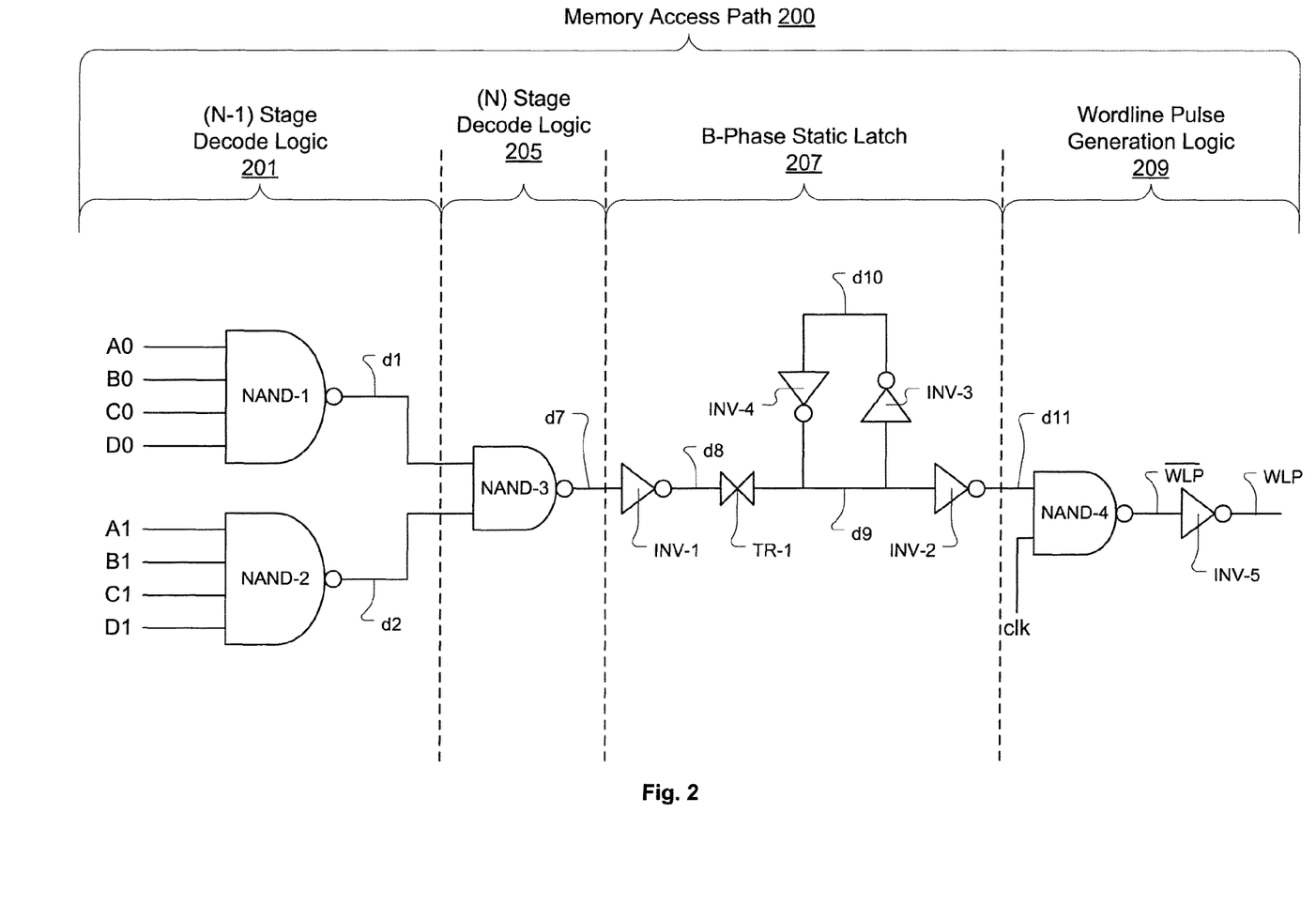
FIG. 2 shows an ending portion of a multi-cycle SRAM timing access path, in accordance with one embodiment of the present invention.

FIG. 2 shows an ending portion of a multi-cycle SRAM timing access path 200, in accordance with one embodiment of the present invention. The ending portion of the multi-cycle SRAM timing access path 200 is referred to as a memory access path 200 for ease of description. The memory access path 200 includes (N−1) stage decode logic 201, (N) stage decode logic 205, a b-phase static latch 207, and wordline pulse generation logic 209.

The (N−1) stage decode logic 201 is defined to receive wordline address decode bits A0, B0, C0, D0 from a first architectural port, e.g., port 0, of a multi-port register file. The (N−1) stage decode logic 201 is also defined to receive wordline address decode bits A1, B1, C1, D1 from a second architectural port, e.g., port 1, of a multi-port register file. The (N−1) stage decode logic 201 includes two 4-to-1 NAND logic gates NAND-1 and NAND-2.

The NAND-1 logic gate is connected to receive the wordline address decode bits A0, B0, C0, and D0 as inputs. The NAND-1 logic gate is defined and connected to perform a NAND logic operation on the wordline address decode bits A0, B0, C0, and D0 from the first read port to generate a decode signal d1. The NAND-2 logic gate is connected to receive the wordline address decode bits A1, B1, C1, and D1 as inputs. The NAND-2 logic gate is defined and connected to perform a NAND logic operation on the wordline address decode bits A1, B1, C1, and D1 from the second read port to generate a decode signal d2.

In the memory access path 200, the decode signals d1 and d2 are transmitted as inputs to the (N) stage decode logic 205. The (N) stage decode logic 205 includes a 2-to-1 NAND logic gate NAND-3 connected to receive the decode signals d1 and d2 as inputs. The NAND-3 logic gate is defined and connected to perform a NAND logic operation on the decode signals d1 and d2 to generate a decode signal d7.

Figure 3:
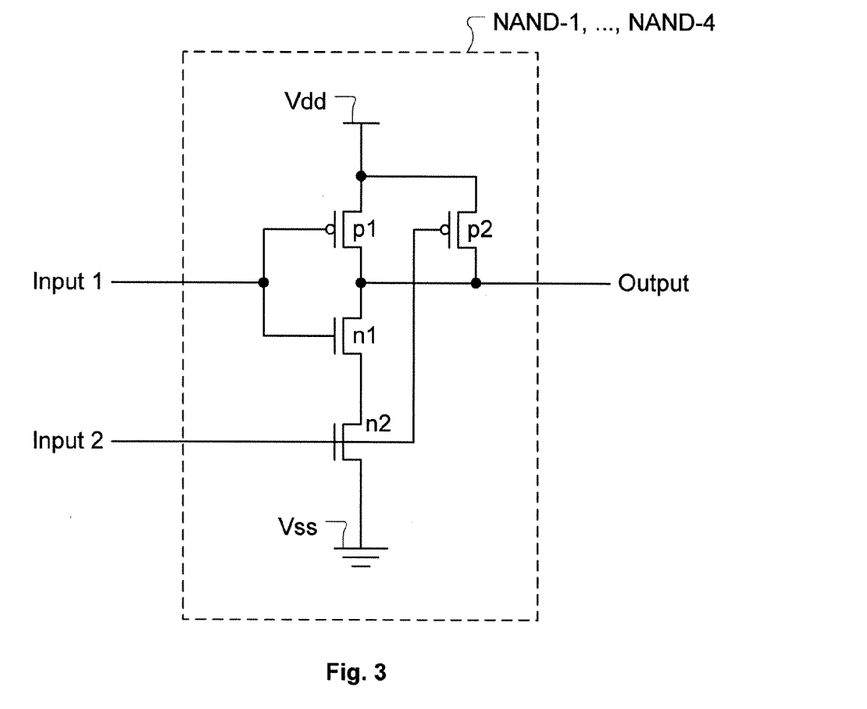
FIG. 3 shows a circuit diagram corresponding to each of the 2-to-1 NAND logic gates NAND-3 and NAND-4 referenced herein, in accordance with one embodiment of the present invention.

FIG. 3 shows a circuit diagram corresponding to each of the 2-to-1 NAND logic gates NAND-3 and NAND-4 referenced herein, in accordance with one embodiment of the present invention. The NAND logic gate receives two inputs (Input 1 and Input 2) and generates an output (Output). In the circuit diagram of the NAND logic gate, p1 and p2 corresponds to PMOS transistors, n1 and n2 correspond to NMOS transistors, Vdd corresponds to a power supply, and Vss corresponds to a reference ground potential.

The decode signal d7 is transmitted to the b-phase static latch 207. Specifically, the decode signal d7 is transmitted to an input of an inverter INV-1, which operates to generate a signal d8 having a logic state opposite that of the decode signal d7. The signal d8 is transmitted through a tri-state transmission gate TR-1 to become a signal d9 on a storage node. The tri-state transmission gate TR-1 is controlled by the clock signal (clk) to transmit the signal d8 through as signal d9 when the clock signal (clk) has a low logic state, and prevent transmission of the signal d8 through as signal d9 when the clock signal (clk) has a high logic state. The signal d9 is maintained on the storage node d9 by serially connected inverters INV-3 and INV-4. Specifically, the signal d9 is transmitted to an input of the inverter INV-3, which operates to generate a signal d10 having a logic state opposite that of the signal d9. Then, the signal d10 is transmitted to an input of the inverter INV-4, which operates to re-generate the original signal d9.

Figure 4:
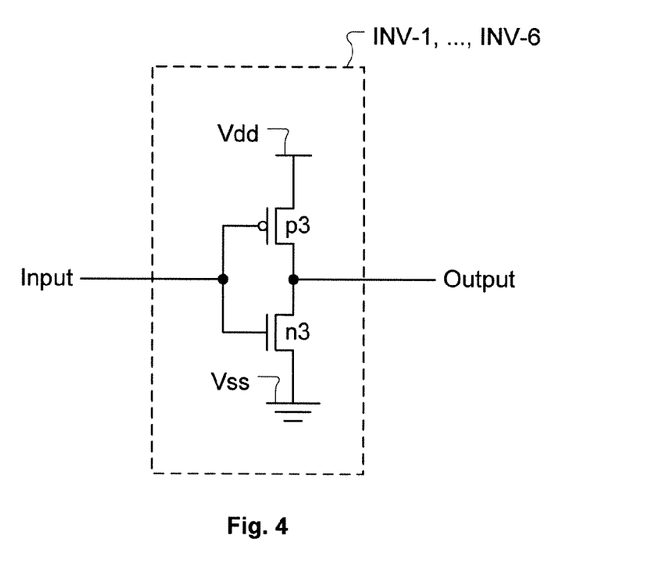
FIG. 4 shows a circuit diagram corresponding to each of the inverters INV-1 through INV-6, in accordance with one embodiment of the present invention.

FIG. 4 shows a circuit diagram corresponding to each of the inverters INV-1 through INV-6, in accordance with one embodiment of the present invention. The inverter receives an input (Input) and generates an output (Output) having a logic state opposite of the input logic state. In the circuit diagram of the inverter, p3 is a PMOS transistor, n3 is an NMOS transistor, Vdd corresponds to a power supply, and Vss corresponds to a reference ground potential.

The signal d9 is also transmitted to an input of an inverter INV-2, which operates to generate a signal d11 having a logic state opposite that of the signal d9. The signal d11 is transmitted to the wordline pulse generation logic 209. The signal d11 is one of two input signals transmitted to a pulse generating NAND logic gate NAND-4. The other input to the pulse generated NAND-4 logic gate is the clock signal (clk). The pulse generating NAND-4 logic gate functions to perform a NAND logic operation on the signal d11 and the clock signal (clk) to generate a signal ($\overline{WLP}$). In this manner, the output signal ($\overline{WLP}$) of the NAND-4 logic gate will only be a low logic state when both the clock signal (clk) and the signal d11 represent high logic states. Therefore, when the signal d11 represents a high logic state, the output signal ($\overline{WLP}$) will cycle with the clock signal (clk), albeit with an opposite logic state relative to the clock signal (clk). The output signal ($\overline{WLP}$) of the NAND-4 logic gate is transmitted to an input of an inverter INV-5, which operates to generate a wordline pulse signal (WLP) having a logic state opposite that of the output signal ($\overline{WLP}$). Therefore, when the signal d11 represents a high logic state, the wordline pulse signal (WLP) will cycle with the clock signal (clk) and have a logic state equal to the clock signal (clk).

Based on the foregoing, it should be understood that the memory access path 200 receives a static address data value and decodes the static address data value to obtain wordline address decode signals A0, B0, C0, D0, A1, B1, C1, D1, d1, d2, and d7, thereby converting the received static address value to a wordline pulse (WLP) for accessing a wordline connected thereto within a memory. In the embodiment of FIG. 2, the b-phase static latch 207 is defined and connected within the memory access patch 200 to ensure that the signal d11 does not randomly switch on or off when it is combined with the clock signal (elk) to generate the wordline pulse (WLP). The b-phase static latch 207 operates to allow the signal d7 present at its input, i.e., the input of inverter INV-1, to pass to its output, i.e., the output of inverter INV-2, as the signal d11 when the clock signal (elk) has a low logic state. The b-phase static latch 207 also operates to store the last logic state of its input signal d7 as signal d10 when the clock signal (clk) has a high logic state. Therefore, when the clock signal (clk) has a high logic state, the tri-state transmission gate TR-1 is off, i.e., non-transmitting, and the signal d10 stored in the b-phase static latch 207 is held stable, and the clock signal (clk) itself is NAND'd with the signal d10 stored in the b-phase static latch 207 (transmitted as signal d11).

It should be understood that when the clock signal (elk) has a low logic state, it doesn't matter what signals d9, d10, d11 are present, because any signal d11 NAND'd with the clock signal (clk) of low logic state will generate the output signal ($\overline{WLP}$) having a high logic state, which in turn corresponds to the wordline pulse (WLP) having a low logic state. Therefore, passing of the signal d7 through the b-phase static latch 207 ensures that the signal d11 at the input to the NAND-4 logic gate is stable for NAND'ing with the clock signal (clk).

As previously discussed, it is an ongoing objective to increase the speed at which memory address signals can be decoded and converted into an appropriate wordline pulse to improve memory read speeds and ensure that signal timing integrity is maintained with circuitry dependent on memory read operations. To this end, FIG. 5 shows a memory access path 500 that utilizes fewer logic gates than the memory access path 200 of FIG. 2, in accordance with one embodiment of the present invention.

Figure 5:
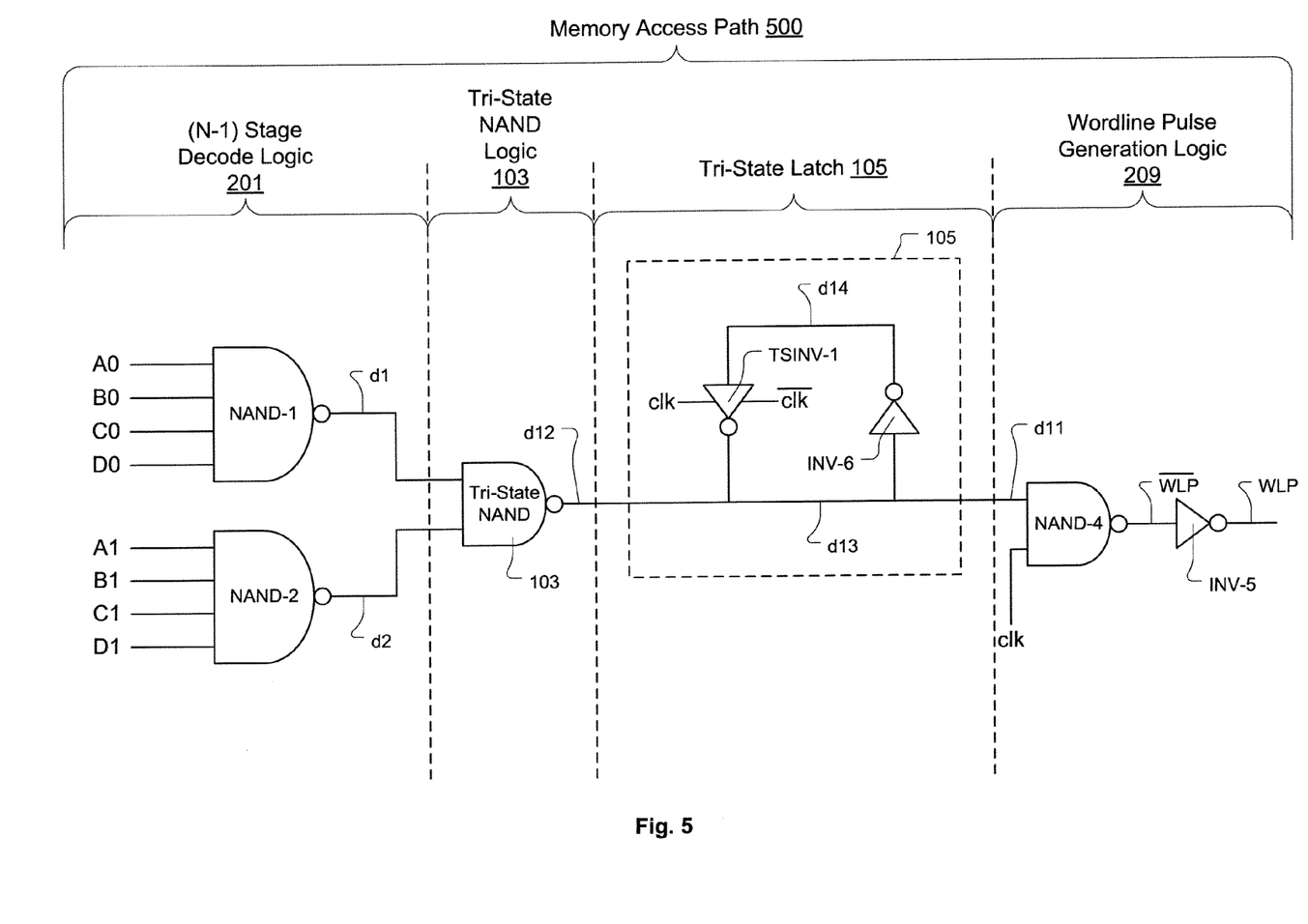
FIG. 5 shows a memory access path that utilizes fewer logic gates than the memory access path of FIG. 2, in accordance with one embodiment of the present invention.

The memory access path 500 of FIG. 5 includes the same logic in the (N−1) stage decode logic 201 as the memory access path 200. However, the (N) stage decode logic 205 and b-phase static latch 207 in the memory access path 200 is replaced with a tri-state NAND 103 and tri-state latch 105 in the memory access path 500. Also, the memory access path 500 includes the same logic in the wordline pulse generation logic 209 as the memory access path 200.

Therefore, in the memory access path 500, the (N−1) stage decode logic 201 is defined and connected to receive wordline address signals A0, B0, C0, D0, A1, B1, C1, D1 and generate decode signals d1 and d2. It should be understood that the (N−1) stage decode logic 201 represents static memory address decode circuitry defined to receive a number of memory address decode signals (A0, B0, C0, D0, A1, B1, C1, D1) and generate the signals d1 and d2 from the number of memory address decode signals. In one embodiment, the number of memory address decode signals at the input to the (N−1) stage decode logic 201 includes four memory address decode signals A0, B0, C0, D0 derived from a memory address received at a first read port and four memory address decode signals A1, B1, C1, D1 derived from a memory address received at a second read port. It should be understood, however, that in other embodiments the memory access path 500 extending from the tri-state NAND 103 through the tri-state latch 105 through the wordline pulse generation logic 209 can be implemented with other configurations of static memory address decode circuitry than that shown in the (N−1) stage decode logic 201 in the example embodiment of FIG. 5.

For purposes of description, the (N−1) stage decode logic 201 is referred to as a next-to-last decode stage 201. The next-to-last decode stage 201 provides the input signals d1 and d2 as first and second input signals to the first and second inputs of the tri-state NAND circuit 103.

The next-to-last decode stage 201 includes a first NAND circuit (NAND-1) and a second NAND circuit (NAND-2). The first NAND circuit (NAND-1) is defined and connected to perform a NAND logic operation on the four memory address decode signals (A0, B0, C0, D0) from the first read port to generate the decode signal (d1). The second NAND circuit (NAND-2) is defined and connected to perform a NAND logic operation on the four memory address decode signals (A0, B0, C0, D0) from the second read port to generate the second decode signal (d2). The signal (d1) is transmitted to the first input of the tri-state NAND circuit 103. The signal (d2) is transmitted to the second input of the tri-state NAND circuit 103.

As previously mentioned, the (N) stage decode logic 205 and b-phase static latch 207 of the memory access path 200 is replaced by a tri-state NAND circuit 103 and a tri-state latch 105 in the memory access path 500. Specifically, the signals d1 and d2 are transmitted from the (N−1) stage decode logic 201 as inputs to the tri-state NAND circuit 103. The tri-state NAND circuit 103 is defined and connected to perform a 2-to-1 NAND logic operation, as shown in FIG. 3, on the first input signal (d1) and the second input signal (d2) to generate and transmit an output signal d12 to a node d13. The tri-state NAND circuit 103 is connected to operate in accordance with a first clock signal (clk) and a second clock signal ($\overline{\text{clk}}$). A logic state of the second clock signal ($\overline{\text{clk}}$) is opposite a logic state of the first clock signal (clk).

Specifically, the tri-state NAND circuit 103 is defined and connected to perform the NAND logic operation on the first and second input signals (d1 and d2) and generate the output signal d12 when the state of the clock signal (clk) is a first logic state, i.e., a low logic state. Also, by way of its tri-state configuration, the tri-state NAND circuit 103 is defined and connected to be non-operative when the state of the clock signal (clk) is a second logic state, i.e., a high logic state. It should be understood that the second logic state of the clock signal (clk=1) is opposite the first logic state of the clock signal (clk=0). Therefore, when the first clock signal (clk) is low and the second clock signal ($\overline{\text{clk}}$) is high, the tri-state NAND circuit 103 performs the NAND logic operation on the signals d1 and d2. And, when the first clock signal (clk) is high and the second clock signal ($\overline{\text{clk}}$) is low, the tri-state NAND circuit 103 is non-operative.

The tri-state latch 105 includes an inverter INV-6 having an input connected to the node d13, and an output connected to a node d14. Therefore, the signal on node d14 has a logic state opposite that of the signal present on node d13. The tri-state latch 105 also includes a tri-state inverter TSINV-1 having an input connected to the node d14, and an output connected to the node d13. Therefore, when in operation, the tri-state inverter TSINV-1 functions to re-generate the original signal present on node d13. The tri-state inverter TSINV-1 is defined and connected to receive, and operate in accordance with, the first clock signal (clk) and the second clock signal ($\overline{\text{clk}}$). That is to say, the tri-state latch circuit 105 is defined and connected to hold a signal present at the node d13 in accordance with the first clock signal (clk) and the second clock signal ($\overline{\text{clk}}$).

The signal present at the node d13 is the output signal d12 from the tri-state NAND circuit 103. The tri-state latch circuit 105 is defined and connected to hold the signal present at the node d13 when the state of the first clock signal (clk) is the second logic state, i.e., the high logic state. Also, by way of its tri-state configuration, the tri-state latch circuit 105 is defined and connected to be non-operative when the state of the first clock signal (clk) is the first logic state, i.e., the low logic state. Therefore, when the first clock signal (clk) is high and the second clock signal ($\overline{\text{clk}}$) is low, the tri-state latch 105 operates to hold the signal d12 on the node d13. And, when the first clock signal (clk) is low and the second clock signal ($\overline{\text{clk}}$) is high, the tri-state latch 105 is non-operative, thereby allowing the signal on node d13 to vary.

It should be understood that by way of their connections to the first clock signal (clk) and the second clock signal ($\overline{\text{clk}}$), the tri-state latch 105 is controlled to be non-operative when the tri-state NAND circuit 103 is controlled to perform the NAND logic operation on the signals d5 and d6. And, correspondingly, the tri-state latch 105 is controlled to hold the signal d12 on the node d13 when the tri-state NAND circuit 103 is controlled to be non-operative. Therefore, the tri-state NAND circuit 103 and the tri-state latch circuit 105 are directed by the first and second clock signals (clk and $\overline{\text{clk}}$) to operate at mutually exclusive times.

The node d13 provides the signal d11 to the input of the pulse generating NAND-4 logic gate. As previously discussed with regard to the memory access path 200 of FIG. 2, the signal d11 is one of two input signals transmitted to the pulse generating NAND-4 logic gate. The other input to the pulse generating NAND-4 logic gate is the clock signal (clk), i.e., the first clock signal (clk). The pulse generating NAND-4 logic gate functions to perform the NAND logic operation on the signal d11 and the first clock signal (clk) to generate a signal ($\overline{\text{WLP}}$) on a node to which the output of the NAND-4 logic gate is connected. In this manner, the output signal ($\overline{\text{WLP}}$) of the NAND-4 logic gate will only be a low logic state when both the first clock signal (clk) and the signal d11 represent high logic states. Therefore, when the signal d11 represents a high logic state, the output signal ($\overline{\text{WLP}}$) will cycle with the first clock signal (clk), albeit with an opposite logic state relative to the first clock signal (clk).

The output signal ($\overline{\text{WLP}}$) of the NAND-4 logic gate is transmitted to an input of the inverter INV-5, which operates to generate the wordline pulse signal (WLP), i.e., memory access pulse, having the logic state opposite that of the output signal ($\overline{\text{WLP}}$). Therefore, when the signal d11 is represents a high logic state, the wordline pulse signal (WLP) will cycle with the first clock signal (clk) and have a logic state equal to the first clock signal (clk).

In comparing the memory access path 500 of FIG. 5 with the memory access path 200 of FIG. 2, the tri-state NAND circuit 103 of the memory access path 500 replaces the (N) stage decode logic 205 and tri-state transmission gate TR-1 of the memory access path 200. Utilization of the tri-state NAND circuit 103 in the memory access path 500 is facilitated by use of the tri-state latch 105. In this manner, the memory access path 500 is able to eliminate the two inverters INV-1 and INV-2 of the memory access path 200 and their associated gate delays, while preserving the logic state management of the memory access path 200. Therefore, the memory access path 500 provides an equivalent logical result for the wordline pulse (WLP) as the memory access path 200, but with two less gate delays, thereby saving two gate delays in the critical memory access path. In one embodiment, as compared to the memory access path 200, the memory access path 500 saves the two gate delays in a fourteen gate delay CPU cycle, thereby improving memory access timing performance by about 14%.

Figure 6:
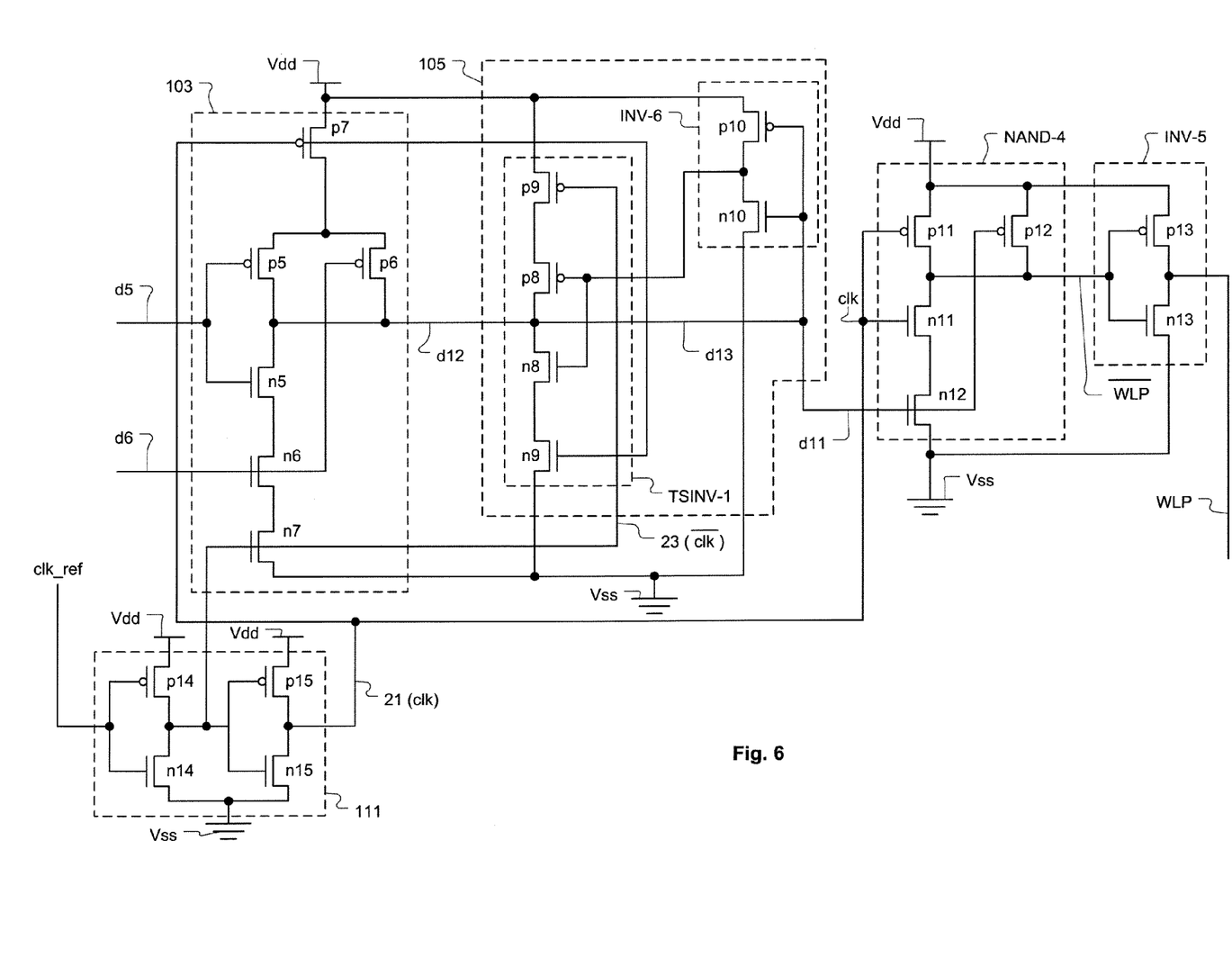
FIG. 6 shows a detailed circuit diagram for the portion of the memory access path of FIG. 5 extending from the signals d1 and d2 through to the wordline pulse (WLP) output, in accordance with one embodiment of the present invention.

FIG. 6 shows a detailed circuit diagram for the portion of the memory access path 500 extending from the signals d1 and d2 through to the wordline pulse (WLP) output, in accordance with one embodiment of the present invention. In the circuit diagram of FIG. 6, the power supply is represented by Vdd, and the reference ground potential is represented by Vss. A clock buffer circuit 111 is defined to drive the first clock signal (clk) and the second clock signal ($\overline{\text{clk}}$), such that the second clock signal ($\overline{\text{clk}}$) has an opposite logic state as that of the first clock signal (clk). The clock buffer circuit 111 includes a first inverter defined by a PMOS transistor p14 and an NMOS transistor n14, that is serially connected to a second inverter defined by a PMOS transistor p15 and an NMOS transistor n15.

A reference clock signal (clk_ref) is received at the input of the first inverter, which drives the second clock signal ($\overline{\text{clk}}$) on a node 23 at the output of the first inverter. The second clock signal ($\overline{\text{clk}}$) is received at the input of the second inverter, which drives the first clock signal (clk) on a node 21 at the output of the second inverter. Both the tri-state NAND circuit 103 and tri-state latch 105 are connected to receive the first and second clock signals (clk and $\overline{\text{clk}}$) on nodes 21 and 23, respectively. Also, the pulse generating NAND circuit (NAND-4) is connected to receive the first clock signal (clk) on node 21.

The tri-state NAND circuit 103 includes a PMOS transistor p5 and an NMOS transistor n5 whose gates are connected to receive the signal d5. The tri-state NAND circuit 103 also includes a PMOS transistor p6 and an NMOS transistor n6 whose gates are connected to receive the signal d6. The two PMOS transistors p5 and p6 are connected in parallel between the power supply Vdd and the output of the tri-state NAND circuit 103 at which the signal d12 is supplied. The two NMOS transistors n5 and n6 are serially connected between the output of the tri-state NAND circuit 103 at which the signal d12 is supplied and the reference ground Vss.

Also, to provide the tri-state functionality to the tri-state NAND circuit 103, a clock controlled PMOS transistor p7 is connected between the power supply Vdd and both of the PMOS transistors p5 and p6. In this manner, the two PMOS transistors p5 and p6 will be connected to the power supply Vdd when the first clock signal (clk) causes the clock controlled PMOS transistor p7 to turn on, i.e., when the first clock signal (clk) is a low logic state. Similarly, a clock controlled NMOS transistor n7 is connected between the NMOS transistor n6 and the reference ground Vss. In this manner, the serially connected NMOS transistors n5 and n6 will be connected to the reference ground Vss when the second clock signal ($\overline{\text{clk}}$) causes the clock controlled NMOS transistor n7 to turn on, i.e., when the second clock signal ($\overline{\text{clk}}$) is a high logic state.

The tri-state latch 105 is connected to receive the signal d12 as an input at the node d13. The inverter INV-6 of the tri-state latch 105 includes a PMOS transistor p10 and an NMOS transistor n10, whose gates are connected to the node d13. The output of the inverter INV-6 is connected to the input of the tri-state inverter TSINV-1. Specifically, the shared node of the PMOS and NMOS transistors p10 and n10 is connected to the gate of both a PMOS transistor p8 and an NMOS transistor n8. The output of the tri-state inverter TSINV-1, i.e., the shared node of the PMOS and NMOS transistors p8 and n8 is connected back to the node d13.

To provide the tri-state functionality to the tri-state latch 150, a clock controlled PMOS transistor p9 is connected between the power supply Vdd and the PMOS transistor p8 of the tri-state inverter TSINV-1. In this manner, the PMOS transistor p8 will be connected to the power supply Vdd when the second clock signal ($\overline{\text{clk}}$) causes the clock controlled PMOS transistor p9 to turn on, i.e., when the second clock signal ($\overline{\text{clk}}$) is a low logic state. Similarly, a clock controlled NMOS transistor n9 is connected between the NMOS transistor n8 and the reference ground Vss. In this manner, the NMOS transistors n8 will be connected to the reference ground Vss when the first clock signal (clk) causes the clock controlled NMOS transistor n9 to turn on, i.e., when the first clock signal (clk) is a high logic state.

The pulse generating NAND circuit (NAND-4) includes a PMOS transistor p11 and an NMOS transistor n11 whose gates are connected to receive the first clock signal (clk) from the node 21. The pulse generating NAND circuit (NAND-4) also includes a PMOS transistor p12 and an NMOS transistor n12 whose gates are connected to receive the signal d11 from the node d13. The two PMOS transistors p11 and p12 are connected in parallel between the power supply Vdd and the output of the pulse generating NAND circuit (NAND-4) at which the signal ($\overline{\text{WLP}}$) is supplied. The two NMOS transistors n11 and n12 are serially connected between the output of the pulse generating NAND circuit (NAND-4) at which the signal ($\overline{\text{WLP}}$) is supplied and the reference ground Vss.

The inverter INV-5 includes a PMOS transistor p13 and an NMOS transistor n13 whose gates are connected to receive the signal ($\overline{\text{WLP}}$) from the output of the pulse generating NAND circuit (NAND-4). The PMOS transistor p13 is connected between the power supply Vdd and an output of the memory access path at which the wordline pulse (WLP) is supplied. And, the NMOS transistor n13 is connected between the output of the memory access path at which the wordline pulse (WLP) is supplied and the reference ground Vss.

Figure 7:
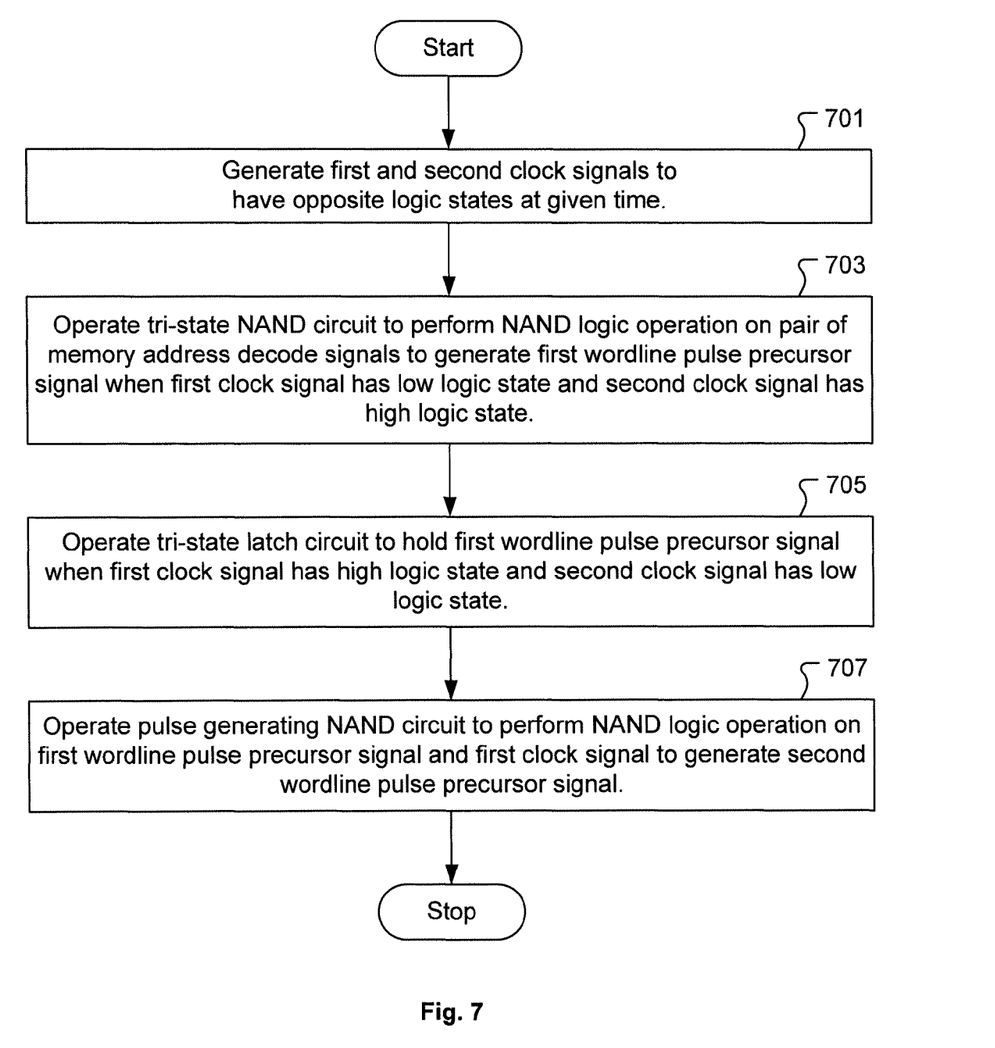
FIG. 7 shows a method for operating a memory timing access path, in accordance with one embodiment of the present invention.

FIG. 7 shows a method for operating a memory timing access path, in accordance with one embodiment of the present invention. The method includes an operation 701 for generating first and second clock signals (clk and $\overline{\text{clk}}$) to have opposite logic states at a given time. The method also includes an operation 703 for operating a tri-state NAND circuit (103) to perform a NAND logic operation on a pair of memory address decode signals (d1 and d2) to generate a first wordline pulse precursor signal (d12) when the first clock signal (clk) has a low logic state and the second clock signal ($\overline{\text{clk}}$) has a high logic state. The method also includes an operation 705 for operating a tri-state latch circuit (105) to hold the first wordline pulse precursor signal (d12) when the first clock signal (clk) has a high logic state and the second clock signal ($\overline{\text{clk}}$) has a low logic state.

The method further includes an operation 707 for operating a pulse generating NAND circuit (NAND-4) to perform a NAND logic operation on the first wordline pulse precursor signal (signal d12 transmitted as signal d11) and the first clock signal (clk) to generate a second wordline pulse precursor signal ($\overline{\text{WLP}}$). It should be understood that the pulse generating NAND circuit (NAND-4) operates for any logic state of either the first wordline pulse precursor signal (signal d12 transmitted as signal d11) or the first clock signal (clk). That is to say, the pulse generating NAND circuit (NAND-4) is not tri-stated. The method can also include an operation for operating an inverter circuit (INV-5) to invert the second wordline pulse precursor signal ($\overline{\text{WLP}}$) to generate a wordline pulse (WLP).

Additionally, the method can include an operation for generating a number of memory address decode signals (A0, B0, C0, D0) from a memory address received at a first read port and a number of memory address decode signals (A1, B1, C1, D1) from a memory address received at a second read port. The method can also include an operation for operating static memory address decode circuitry (i.e., the (N−1) stage decode logic 201) to generate the pair of memory address decode signals (d1 and d2) from the number of memory address decode signals (A0, B0, C0, D0, A1, B1, C1, D1).

While this invention has been described in terms of several embodiments, it will be appreciated that those skilled in the art upon reading the preceding specifications and studying the drawings will realize various alterations, additions, permutations and equivalents thereof. Therefore, it is intended that the present invention includes all such alterations, additions, permutations, and equivalents as fall within the true spirit and scope of the invention.

What is claimed is:

1. A circuit, comprising:
   a tri-state NAND circuit having a first input connected to receive a first input signal and a second input connected to receive a second input signal, the tri-state NAND circuit connected to operate in accordance with a first clock signal and a second clock signal, a logic state of the second clock signal opposite a logic state of the first clock signal, the tri-state NAND circuit connected to transmit an output signal to a first node;
   a tri-state latch circuit connected to hold a signal present at the first node in accordance with the first clock signal and the second clock signal; and
   a pulse generating NAND circuit having a first input connected to the first node and a second input connected to receive the first clock signal, the pulse generating NAND circuit connected to transmit an output signal to a second node.

2. A circuit as recited in claim 1, further comprising:
an inverter circuit having an input connected to the second node, the inverter circuit connected to transmit an output signal as a memory access pulse.

3. A circuit as recited in claim 2, wherein the memory access pulse has a high logic state only when both the signal present on the first node and the first clock signal have a high logic state.

4. A circuit as recited in claim 2, wherein an output of the inverter circuit is connected to a wordline of a static random access memory.

5. A circuit as recited in claim 1, wherein the tri-state NAND circuit is defined and connected to perform a NAND logic operation on the first input signal and the second input signal when the state of the first clock signal is a first logic state, and wherein the tri-state NAND circuit is defined and connected to be non-operative when the state of the first clock signal is a second logic state, the second logic state opposite the first logic state.

6. A circuit as recited in claim 5, wherein the tri-state latch circuit is defined and connected to hold the signal present at the first node when the state of the first clock signal is the second logic state, and wherein the tri-state latch circuit is defined and connected to be non-operative when the state of the first clock signal is the first logic state.

7. A circuit as recited in claim 6, wherein the first logic state is a low logic state, and wherein the second logic state is a high logic state.

8. A circuit as recited in claim 1, further comprising:
static memory address decode circuitry defined to generate the first input signal and the second input signal from a number of memory address signals.

9. A circuit as recited in claim 8, wherein the number of memory address signals includes a memory address received at a first read port and a memory address received at a second read port.

10. A circuit as recited in claim 9, wherein the static memory address decode circuitry includes a next-to-last decode stage defined and connected to provide the first and second input signals to the first and second inputs of the tri-state NAND circuit.

11. A circuit as recited in claim 10, wherein the next-to-last decode stage includes a first NAND circuit and a second NAND circuit,
the first NAND circuit defined and connected to perform a NAND logic operation on four memory address decode signals generated from the memory address received at the first read port to generate a first decode signal,
the second NAND circuit defined and connected to perform a NAND logic operation on four memory address decode signals generated from the memory address received at the first read port to generate a second decode signal.

12. A circuit as recited in claim 1, wherein the tri-state NAND circuit and tri-state latch circuit are defined and connected to operate at mutually exclusive times.

13. A memory timing access path, comprising:
a tri-state NAND circuit defined and connected to perform a NAND logic operation on a pair of memory address decode signals to generate a first wordline pulse precursor signal upon operation of the tri-state NAND circuit as directed by first and second clock signals, the first and second clock signals having opposite logic states;
a tri-state latch circuit defined and connected to hold the first wordline pulse precursor signal upon operation of the tri-state latch circuit as directed by the first and second clock signals, wherein the tri-state NAND circuit and the tri-state latch circuit are directed by the first and second clock signals to operate at mutually exclusive times; and
a pulse generating NAND circuit defined and connected to perform a NAND logic operation on the first wordline pulse precursor signal and the first clock signal to generate a second wordline pulse precursor signal.

14. A memory timing access path as recited in claim 13, wherein the tri-state NAND circuit is defined and connected to perform the NAND logic operation when the first clock signal has a low logic state and the second clock signal has a high logic state, and
wherein the tri-state latch circuit is defined and connected to hold the first wordline pulse precursor signal when the first clock signal has a high logic state and the second clock signal has a low logic state.

15. A memory timing access path as recited in claim 13, further comprising:
an inverter circuit defined and connected to invert the second wordline pulse precursor signal to generate a wordline pulse.

16. A method for operating a memory timing access path, comprising:
generating first and second clock signals to have opposite logic states at a given time;
operating a tri-state NAND circuit to perform a NAND logic operation on a pair of memory address decode signals to generate a first wordline pulse precursor signal when the first clock signal has a low logic state and the second clock signal has a high logic state;
operating a tri-state latch circuit to hold the first wordline pulse precursor signal when the first clock signal has a high logic state and the second clock signal has a low logic state; and
operating a pulse generating NAND circuit to perform a NAND logic operation on the first wordline pulse precursor signal and the first clock signal to generate a second wordline pulse precursor signal.

17. A method for operating a memory timing access path as recited in claim 16, further comprising:
operating an inverter circuit to invert the second wordline pulse precursor signal to generate a wordline pulse.

18. A method for operating a memory timing access path as recited in claim 16, wherein the pulse generating NAND circuit operates for any logic state of either the first wordline pulse precursor signal or the first clock signal.

19. A method for operating a memory timing access path as recited in claim 16, further comprising:
receiving a number of memory address signals at a first read port and a second read port; and
operating static memory address decode circuitry to generate the pair of memory address decode signals from the number of memory address signals received at the first read port and the second read port.

20. A method for operating a memory timing access path as recited in claim 19, wherein one memory address is received at the first read port and one memory address is received at the second read port.

* * * * *